United States Patent
Yap et al.

(10) Patent No.: US 9,129,981 B2
(45) Date of Patent: Sep. 8, 2015

(54) METHODS FOR THE PRODUCTION OF MICROELECTRONIC PACKAGES HAVING RADIOFREQUENCY STAND-OFF LAYERS

(71) Applicants: Weng F. Yap, Phoenix, AZ (US); Eduard J. Pabst, Mesa, AZ (US)

(72) Inventors: Weng F. Yap, Phoenix, AZ (US); Eduard J. Pabst, Mesa, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/090,975

(22) Filed: Nov. 26, 2013

(65) Prior Publication Data

US 2015/0145108 A1    May 28, 2015

(51) Int. Cl.

| | |
|---|---|
| *H01L 21/00* | (2006.01) |
| *H01L 23/66* | (2006.01) |
| *H01L 21/768* | (2006.01) |
| *H01L 23/538* | (2006.01) |
| *H01L 23/498* | (2006.01) |

(52) U.S. Cl.
CPC .............. *H01L 23/66* (2013.01); *H01L 21/768* (2013.01); *H01L 23/49822* (2013.01); *H01L 23/49827* (2013.01); *H01L 23/5389* (2013.01); *H01L 23/49816* (2013.01)

(58) Field of Classification Search
None
See application file for complete search history.

(56) References Cited

U.S. PATENT DOCUMENTS

| | | | |
|---|---|---|---|
| 2009/0309212 A1* | 12/2009 | Shim et al. | 257/700 |
| 2010/0059854 A1* | 3/2010 | Lin et al. | 257/528 |
| 2010/0244208 A1* | 9/2010 | Pagaila et al. | 257/659 |
| 2011/0316117 A1 | 12/2011 | Kripesh et al. | |
| 2012/0104590 A1* | 5/2012 | Do et al. | 257/690 |

* cited by examiner

*Primary Examiner* — Michael Jung
(74) *Attorney, Agent, or Firm* — Ingrassia Fisher & Lorenz, P.C.

(57) ABSTRACT

Microelectronic packages and methods for fabricating microelectronic packages are provided. In one embodiment, the method includes producing a plurality of vertically-elongated contacts in ohmic contact with interconnect lines contained within one or more redistribution layers built over the frontside of a semiconductor die. A molded radiofrequency (RF) separation or stand-off layer is formed over the redistribution layers through which the plurality of vertically-elongated contacts extend. An antenna structure is fabricated or otherwise provided over the molded RF stand-off layer and electrically coupled to the semiconductor die through at least one of the plurality of vertically-elongated contacts.

20 Claims, 6 Drawing Sheets

US 9,129,981 B2

METHODS FOR THE PRODUCTION OF MICROELECTRONIC PACKAGES HAVING RADIOFREQUENCY STAND-OFF LAYERS

TECHNICAL FIELD

Embodiments of the present invention relate generally to microelectronic packaging and, more particularly, to microelectronic packages having one or more radiofrequency stand-off layers and methods for fabricating the same.

BACKGROUND

Fan-Out Wafer Level Packaging ("FO-WLP") processes are well-known within the semiconductor industry for producing microelectronic packages having peripheral fan-out areas, which enlarge the surface area of the package frontside over which a contact array may be formed. In an example of an FO-WLP packaging approach, a pick-and-place tool is used to position an array of semiconductor die within the central opening of a taped mold frame. An encapsulant is dispensed into the mold frame and over the array of semiconductor die. The encapsulant is thermally cured to produce a molded panel in which the array of semiconductor die is embedded, and the taped mold frame is removed to reveal the frontside of the molded panel through which the semiconductor die are exposed. After backside grinding and additional curing of the panel, a carrier is attached to the panel backside to allow a number of build-up layers or Redistribution Layers ("RDL layers"), as well as a Ball Grid Array ("BGA") or other contact array, to be formed over the panel frontside and the die exposed therethrough. The RDL layers include successively-deposited dielectric layers in which a number of metal traces or interconnect lines are formed to provide electrically-conductive paths between the bond pads of the embedded die and the overlying BGA. Finally, in most cases, the molded panel is singulated to yield a number of microelectronic packages each containing a different encapsulated semiconductor die.

BRIEF DESCRIPTION OF THE DRAWINGS

At least one example of the present invention will hereinafter be described in conjunction with the following figures, wherein like numerals denote like elements, and.

Figure 1:
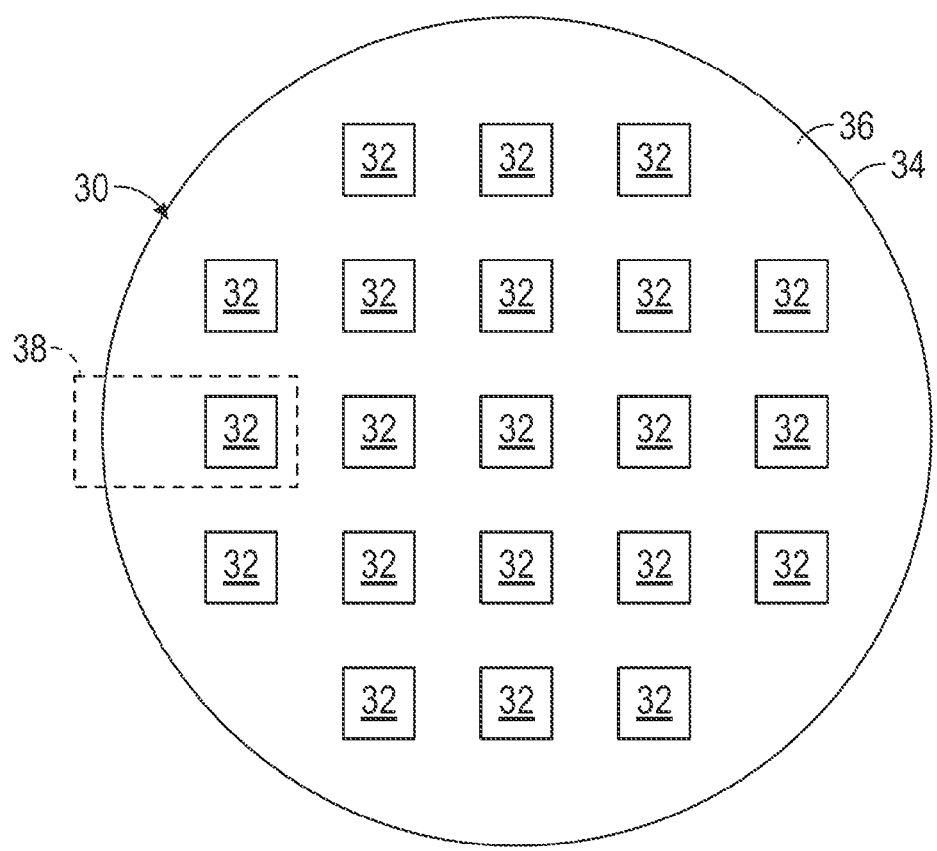
FIG. 1 is a top-down view of an exemplary molded panel in which a plurality of semiconductor die has been embedded and which may undergo further processing to produced one or more microelectronic packages including one or more radiofrequency stand-off layers in accordance with certain embodiments of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," "overlying," "underlying," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers.

As further appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the FO-WLP package, such as prefabricated via structures and prefabricated antenna structures. The terms "System-in-Package," "SiP," and "SiP package" are further utilized herein to refer to a microelectronic package including at least one semiconductor die packaged and electrically interconnected with at least one passive microelectronic component.

It has become desirable to produce a wafer level microelectronic package, such as a FO-WLP package, having one or more frontside antenna structure overlying the packaged semiconductor die and the RDL layers built thereover. However, by forming one or more antenna structures over the RDL layers, the antenna structures may be placed in relatively close proximity to any ground/power planes contained within the RDL layers, as well as to the underlying semiconductor die. If a sufficient dielectric gap or stand-off is not provided between the antenna structures and the ground/power planes, unacceptable levels of RF interference may occur during operation of the microelectronic package. The magnitude of the stand-off required to reduce RF interference to acceptable levels will vary depending upon package design, but often approaches or exceeds 100 microns (μm), as taken vertically through the package thickness. RDL dielectric layer thickness is typically a fraction of this value (e.g., between 15 and 20 μm) and generally cannot be increased to remotely approach the desired stand-off due to limitations inherent in the lithographical patterning process. Consequently, the provision of such a relatively large (e.g., >100 μm) stand-off utilizing a conventional RDL build-up process generally necessitates the deposition of multiple (e.g., five or more) dielectric layers over the ground/power planes and the formation of overlapping contacts within each layer to provide the desired interconnections with the overlying antenna structure or structures. The production of multiple additional RDL layers, which are otherwise unneeded for package functionality, adds undesired cost and delay to the package fabrication process.

The following describes embodiments of method for producing a wafer level microelectronic packages wherein a stand-off is provided between one or more frontside antenna structures and underlying features within the package (e.g., ground/power planes included within the RDL layers and/or the embedded die), which could potentially cause RF interference in the absence of such a stand-off. As will be described below, this stand-off is provided by at least one molded RF-separation or stand-off layer, which is formed over the RDL layers and which has a thickness exceeding the RDL dielectric layer thickness. Advantageously, the molded RF stand-off layer eliminates the need for the provision of multiple additional RDL layers, which are otherwise unneeded for package functionality. As a result, the below-described fabrication method enables the production of RF stand-offed wafer level packages in a relatively efficient, straightforward, and cost effective manner. For purposes of explanation, embodiments of the fabrication method are described primarily in conjunction with production of one or more exemplary FO-WLP packages, which may be produced by processing a molded panel of the type described below in conjunction with FIG. 1. This notwithstanding, it is emphasized that the below-described fabrication method can also be utilized to produce other types of wafer level packages; e.g., in further embodiments, the below-described process steps can be performed on a wafer level to produce a number of Fan-In Wafer-Level Packages (FI-WLP packages) or Chip Scale Packages (CSP packages).

FIG. 1 is a top-down view of a molded panel 30 containing a number of semiconductor die 32, which may be processed to produce one or more microelectronic packages in accordance with an exemplary embodiment of the present invention. For the purposes of explanation, molded panel 30 is shown as containing a relatively small array of microelectronic devices consisting of substantially identical semiconductor die 32. It will be appreciated, however, that the semiconductor die embedded within molded panel 30 need not be identical and may vary in shape, dimensions, and/or layout in further embodiments. Additionally, various other types of microelectronic devices (e.g., passive components, such as inductors, resistors, capacitors, and the like) can be embedded within molded panel 30 along with semiconductor die 32 when, for example, it is desired to produce one or more SiP FO-WLP packages from panel 30. Molded panel 30 includes a panel body having an outer circumferential portion 34 (referred to herein as "panel edge region 34") and a major surface 36 through which semiconductor die 32 are exposed (referred to herein as "frontside surface 36"). At this juncture in the fabrication process, semiconductor die 32 have undergone wafer level processing to produce one or more integrated circuits thereon. Bond pads (e.g., bond pads 44 shown in FIGS. 2-9) are disposed on the frontsides of die 32 to provide points-of-contact to the circuits carried thereby. As explained below, a number of redistribution layers are subsequently built-up over the frontside of molded panel 30 containing electrically-conductive interconnect lines, which provide electrical communication with the bond pads of the embedded die 32.

By way of non-limiting example, one process suitable for producing molded panel 30 is performed as follows. First, semiconductor die 32 are distributed in a desired spatial arrangement over the upper surface of a temporary substrate, which may include an upper adhesive tape layer. If desired, one more release layers may also be applied or otherwise formed over the substrate's upper surface prior to positioning of the die. A mold frame, which has a central cavity or opening therethrough, is positioned over the temporary substrate and around the array of semiconductor die 32 utilizing a pick-and-place tool. A dielectric mold compound or encapsulant, such as a silica-filled epoxy, is then dispensed into the cavity of the mold frame and flows over semiconductor die 32. Sufficient volume of the encapsulant is typically dispensed over semiconductor die 32 to enable the encapsulant to flow over the backsides or non-contact-bearing surfaces of die 32. The encapsulant may then be solidified by, for example, an oven cure to yield a solid panel body in which semiconductor die 32 are embedded. Molded panel 30 is conveniently produced as a relatively thin, disc-shaped body or mass having a generally circular planform geometry; however, panel 30 can be fabricated to have any desired dimensions and planform shape, such as a rectangular shape. The panel body may be rigid or flexible, depending upon the chosen encapsulant. The panel body is then released from the temporary substrate to reveal the frontside 36 of panel 30 through which die 32 are exposed. If desired, the backside of the panel body may be ground or polished to bring molded panel 30 to a desired thickness prior to release of the panel body from the carrier. Other electrically conductive components, such as a power/ground plane, can also be encapsulated in panel 30 along with die 32 in further embodiments. The foregoing example notwithstanding, molded panel 30 can be produced utilizing other known fabrication techniques in further embodiments including, but not limited to, compression molding and lamination processes.

Figure 2:
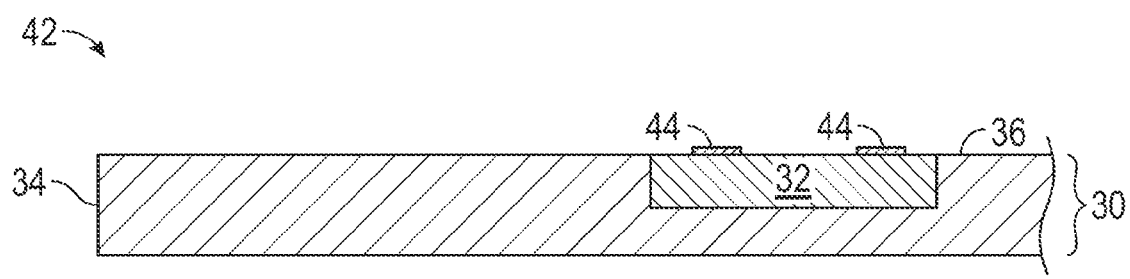
FIGS. 2-9 are cross-sectional views of a FO-WLP package shown at various stages of completion, which may be produced utilizing the molded panel shown in FIG. 1 and which is illustrated in accordance with a first exemplary embodiment of the microelectronic package fabrication method.

FIG. 2 is a cross-sectional view taken through a portion of molded panel 30 containing a single semiconductor die 32 and extending to panel edge region 34 (demarcated in FIG. 1 by dashed box 38). Semiconductor die 32 includes a frontside over which a plurality of bond pads 44 are disposed (only two of which are visible in FIG. 2). As indicated above, the frontside of die 32 and, therefore, bond pads 44 are exposed through frontside 36 of molded panel 30. Hereafter, the following description and the accompanying figures will focus primarily on the processing of the portion of molded panel 30 shown in FIG. 2 and the production of a single FO-WLP package (further shown at various stages of completion in FIGS. 3-9). While the following description focuses on the processing of a relatively small region of molded panel 30 containing a single die 32, it will be understood that the below-described process steps can be performed globally across molded panel 30 and for all die 32 embedded within panel 30. After performance of the below-described fabrication process, molded panel 30 may be singulated to yield a plurality of FO-WLP packages each containing one or more of die 32 embedded within a singulated piece of panel 30. Alternatively, molded panel 30 may not be singulated and the entire panel may serve as a single FO-WLP package, as further described below.

Figure 3:
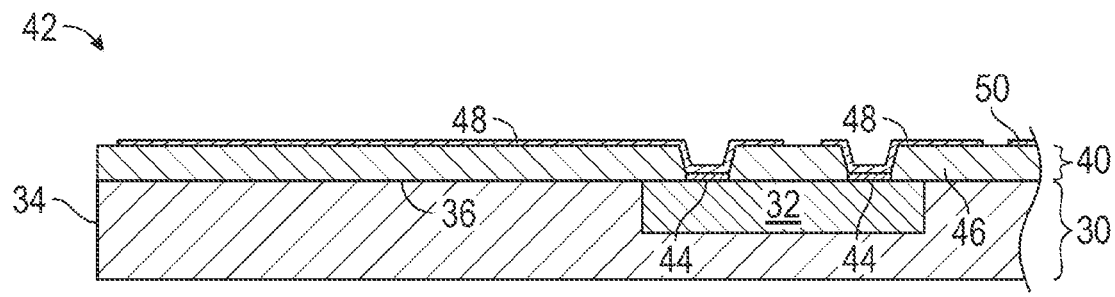

FIG. 3 illustrates molded panel 30 (partially shown) after a number of RDL layers 40 have been built thereover. As noted above, the illustrated region of molded panel 30 is processed to produce a FO-WLP package, which is shown in a partially-completed state in FIG. 3 and identified hereafter by reference numeral "42." In illustrated exemplary embodiment, RDL layers 40 include a dielectric layer 46 and a patterned metal layer or level 48, 50. Dielectric layer 46 may be produced by depositing a photoimagable dielectric material over frontside 36 of molded panel 30; e.g., as a more specific example, a polymer-based photoresist material may be spun onto panel 30. After application, dielectric layer 46 is lithographically patterned to form a number of openings therein exposing bond pads 44. A metal layer or level is then formed over dielectric layer 46 and in ohmic contact with bond pads 44 exposed through the openings in layer 46. The metal level is then patterned to produce a first or "$M_1$" metal level 48, 50 in contact with bond pads 44 to yield the structure shown in FIG. 3.

By way of non-limiting example, patterned $M_1$ metal level 48, 50 may be produced as follows. First, a seed layer is sputtered onto dielectric layer 46. Photoresist is then spun-on or otherwise deposited onto the seed layer and lithographically patterned to expose selected regions of the seed layer. The exposed regions of the seed layer are then plated to define a number of electrically-conductive features across $M_1$ metal level 48, 50. The photoresist is then stripped, and the non-plated portions of the seed layer are removed by selective etching to electrically isolate the various features formed in $M_1$ metal level 48, 50. As indicated in FIG. 3, these features may include a number of interconnect lines 48 in ohmic contact with bond pads 44 and extending (at least in substantial part) over dielectric layer 46. $M_1$ metal level 48, 50 may also be patterned to define a ground/power plane 50 (only a relatively small portion of which can be seen in FIG. 3). After patterning in $M_1$ metal level 48, 50, additional dielectric layers and patterned metal levels (e.g., two or more metal levels) may be produced depending upon the routing complexity and other design characteristics of FO-WLP package 42.

After completion of the RDL layer build-up over FO-WLP package 42 and, more generally, over molded panel 30, a number of vertically-elongated contacts are produced in ohmic contact with selected regions of interconnect lines 48. As appearing herein, the phrase "vertically-elongated contact" refers to an electrically-conductive body or structure having a height greater than the thickness of any given dielectric layer or metal level included within the underlying RDL layers, such as dielectric layer 46 or $M_1$ metal level 48, 50 included within RDL layers 40 shown in FIG. 3. The vertically-elongated contacts are preferably, although not necessarily, fabricated to have heights (or major diameters) greater than the widths (or minor diameters) thereof. The vertically-elongated contacts can comprise any type of electrically-conductive body or structure suitable for usage during microelectronic processing and capable of providing electrical communication across the subsequently-formed molded RF stand-off layer, as described below. In certain embodiments, the vertically-elongated contacts may be formed as solder balls or solder-plated metal spheres of the type described below in conjunction with FIGS. 14-16. Alternatively, the vertically-elongated contacts may be produced as plated metal (e.g., copper) pillars as described more fully below in conjunction with FIG. 4.

Figure 4:
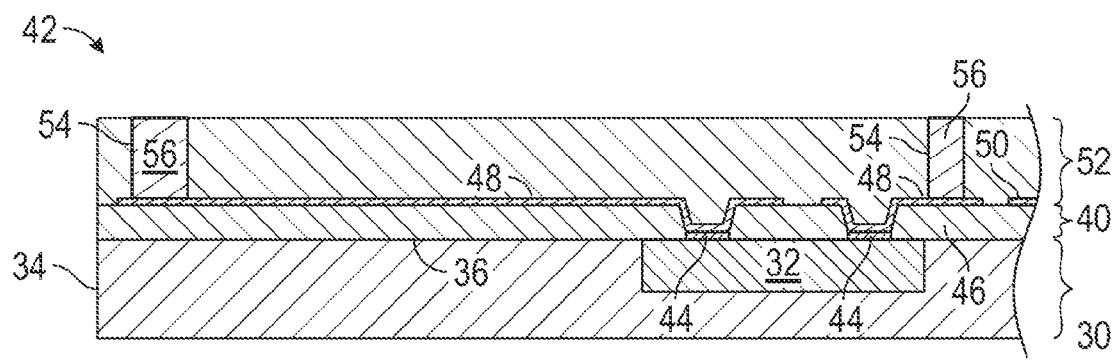

FIG. 4 illustrates partially-completed FO-WLP package 42 after the production of a number of vertically-elongated contacts in the form of plated metal columns or pillars 56. Plated pillars 56 are produced over RDL layers 40 and in ohmic contact with selected regions of interconnect lines 48. As indicated FIG. 4, plated pillars 56 may be produced by first depositing of a layer of photoresist 52 over RDL layers 40 and then patterning photoresist layer 52 to produce a number of vertical tunnels or openings 54 therein. Openings 54 expose selected regions of interconnect lines 48 through photoresist layer 52. A plating process is subsequently carried-out to gradually build-up plated pillars 56 within openings 54 and over the exposed regions of interconnect lines 48. Pillars 56 may be produced by plating-up copper or another metallic material. Photoresist layer 52 is then stripped by, for example, ashing to yield a number of plated pillars 56 projecting upward away from RDL layers 40 and frontside 36 of molded panel 30. Subsequent to the removal of photoresist layer 52, plated pillars 56 are substantially laterally unsupported and may thus be referred to as "freestanding plated pillars 56." In further embodiments wherein RDL layers 40 include additional metal levels, certain ones of plated pillars 56 may be formed in ohmic contact with interconnect lines contained within one metal level in RDL layers 40 (e.g., the $M_1$ metal level), while other pillars 56 are formed in ohmic contact with interconnect lines contained within another metal level of the RDL layers 40 (e.g., the $M_2$ metal level).

Figure 5:
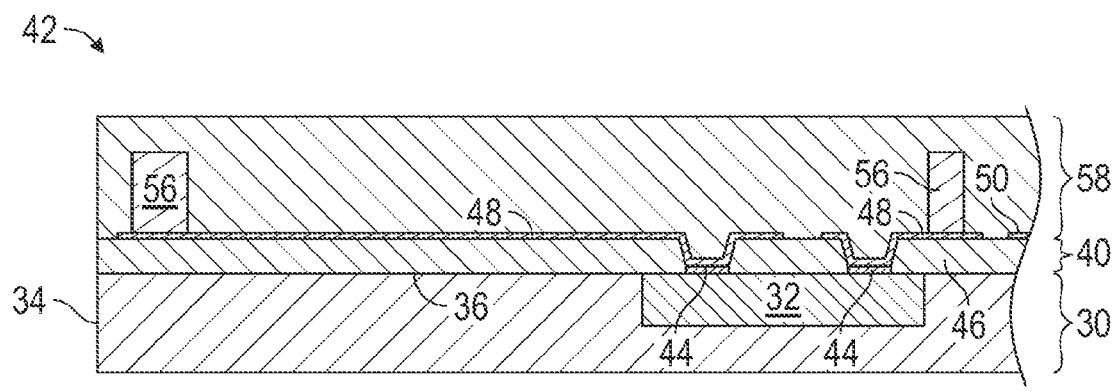
Figure 6:
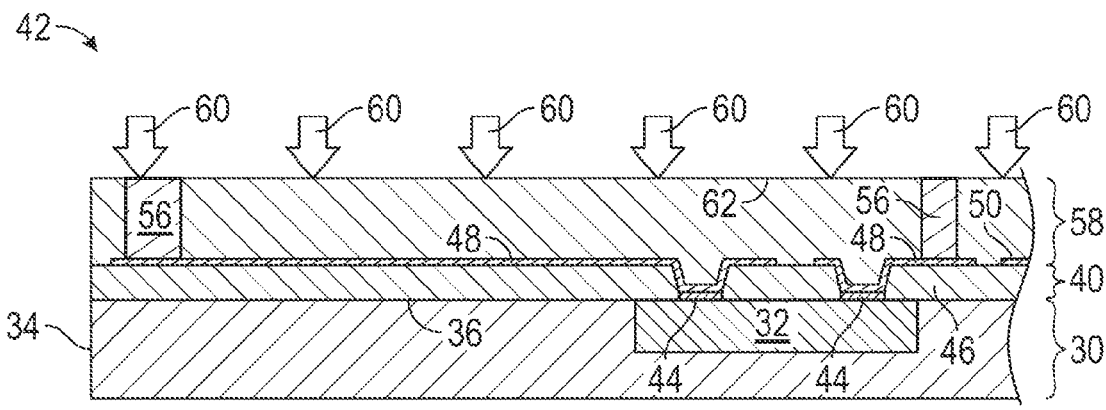

Turning to FIG. 5, a mold material is next dispensed over RDL layers 40 and around freestanding plated pillars 56. The mold material can comprise any flowable dielectric material, such as a silica-filled epoxy or epoxy resin. The mold material is then cured to produce a molded RF separation or stand-off layer 58. A variety of different molding processes can be utilized to produce molded RF stand-off layer 58 including, but not necessarily limited to, pour molding, injection molding, compression molding, and lamination processes. In one embodiment, a molding process similar to that used to produce molded panel 30 is employed to form RF stand-off layer 58. In this regard, a mold frame may first be positioned around panel 30, which may be supported by a non-illustrated carrier or other platform. The selected molded material may then be poured over panel 30 in sufficient volume to cover the upper surface of RDL layers 40 and surround plated pillars 56. The mold compound is then cured by, for example, heat treatment in a specialized oven. Afterwards, the mold frame may be removed and additional curing may be performed as needed to yield the structure shown in FIG. 5.

The mold compound utilized to produce RF stand-off layer 58 is preferably deposited to a sufficient volume to fully envelope and cover plated pillars 56, as shown in FIG. 5.

Planarization process may thus be carried-out (represented in FIG. 6 by arrows 60) to expose plated pillars 56 through RF stand-off layer 58 and to impart layer 58 with a planar outer surface 62; the term "planar," as appearing herein, denoting a surface having a roughness less than 1 µm and, more preferably, less than 0.5 µm. Planarization of molded RF stand-off layer 58 can be carried-out utilizing a grinding process, a Chemical-Mechanical Polishing (CMP) process, or a combination thereof. In addition to imparting layer 58 with a planar upper surface 62, planarization brings molded RF stand-off layer 58 to its final desired thickness. The final thickness of molded RF stand-off layer 58 will vary amongst different embodiments depending upon the stand-off or separation requirements of package 42 and other criteria. It is generally preferred, however, that molded RF stand-off layer 58 is produced to have a final thickness exceeding about 70 µm and, more preferably, a final thickness between about 100 µm and about 250 µm. In further embodiments, the final thickness of layer 58 may be greater than or less than the aforementioned ranges. In further embodiments, RF stand-off layer 58 is produced to have a thickness greater than and, preferably, at least twice the thickness of any given dielectric layer included within RDL Layers 40 (e.g., such as dielectric layer 46) including the last or outermost dielectric layer included within layers 40. The height of plated pillars 56 will typically be substantially equivalent to the thickness of molded RF stand-off layer 58 less the thickness of interconnect lines 48; e.g., in one embodiment, plated pillars 56 are each produced to have a height greater than about 70 µm.

Figure 7:
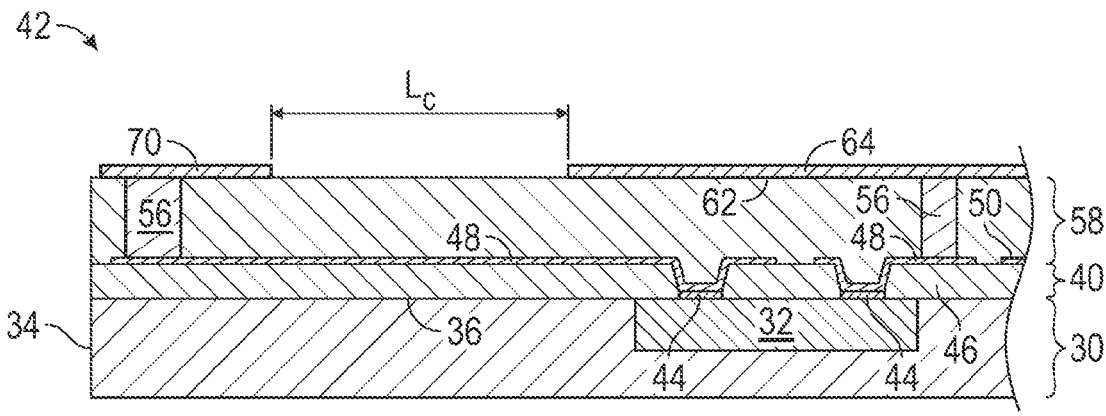
Figure 10:
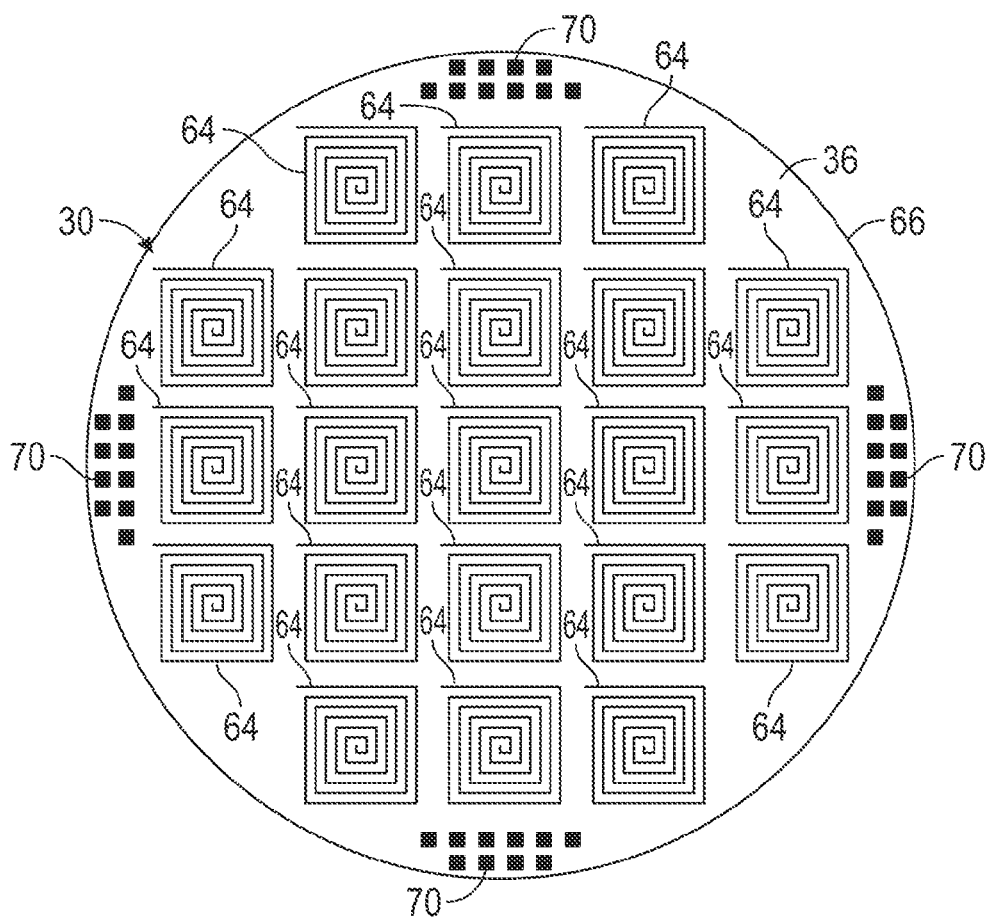
FIG. 10 is a top-down view illustrating one manner in which the molded panel shown in FIG. 1 may appear after the production of an antenna array and a number of bond pads arrays thereover.

Advancing to FIG. 7, a frontside antenna structure 64 is next provided over molded RF stand-off layer 58 electrically coupled to one or more of vertically-elongated contacts 56. Antenna structure 64 may be formed to have square spiral geometry or any other planform shape suitable for receiving and/or transmitting RF signals, as viewed from a top-down perspective (see, for example, FIG. 10). Antenna structure 64 may be provided by positioning a prefabricated structure, such as a precut metal film, over molded RF stand-off layer 58 and in ohmic contact with one or more of plated pillars 56. In this case, the prefabricated antenna structure 64 may be bonded to RF stand-off layer 58 utilizing a die attach material or other adhesive. In further embodiments, antenna structure 64 may be provided by attaching a discrete device, such as a surface mount device, to partially-completed package 42 utilizing a solder paste material. Alternatively, in still further embodiments, antenna structure 64 may be provided by direct fabrication on molded RF stand-off layer 58 utilizing a process similar to that employed to produce patterned $M_1$ metal level 48, 50. For example, antenna structure 64 can be produced by sputtering a seed layer over planar surface 62 of molded RF stand-off layer 58, depositing a layer of photoresist, patterning the photoresist to expose selected regions of the seed layer, plating the exposed regions of the seed layer to define the shape of antenna structure 64, stripping the photoresist, and then etching away the portions of the seed layer that do not underlie antenna structure 64. If desired, a dielectric layer 66 may be spun-on or otherwise deposited over antenna structure 64 and then patterned to create at least one opening 68, which exposes some or all of antenna structure 64 through layer 66. The structure shown in FIG. 8 results.

Figure 8:
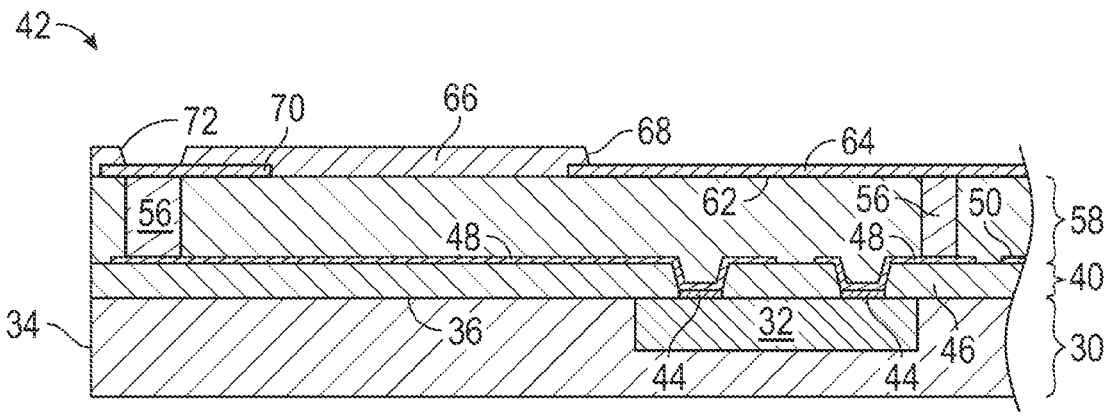

Additional electrically-conducive features may also be formed in the same metal level as is antenna structure 64. For example, a number of bond pads 70 (only one of which is shown in FIG. 8) may be produced in ohmic contact with selected pillars 56 to allow ground of power supply to die 32. Power/ground bond pads 70 may be located within peripheral edge region 34 of molded panel 30 and offset from antenna structure 64 by a lateral stand-off or clearance ($L_C$) sufficient to avoid or at least minimize cross-talk therebetween; e.g., $L_C$ may be greater than about 100 µm in an embodiment. An equivalent or greater lateral clearance may also be provided between pillars 56 in ohmic contact with bond pads 70 and the overlying antenna structure 64. If dielectric layer 66 is deposited over power/ground bond pads 70, additional openings 72 may be formed in layer 66 to expose at least a portion of each bond pad 70. In certain embodiments, solder balls or other electrically-conductive bodies may be produced in contact with bond pads 70 and serve as the contact array of FO-WLP package 42. In other embodiments, power/ground bond pads 70 may themselves serve as the externally-accessible contact array of package 42. In this latter case, FO-WLP package 42 may be interconnected to a larger system for power supply and grounding purposes utilizing, for example, wire bond connections 74 shown in indicated in FIG. 9.

Figure 9:
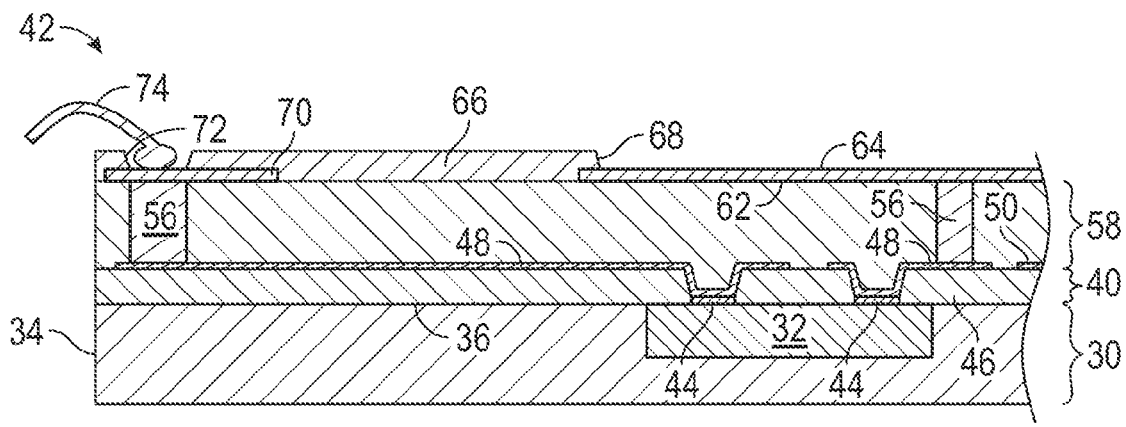

Additional frontside antenna structures may be produced over the other semiconductor die 32 embedded within molded panel 30 (FIG. 1) in parallel with the production of antenna structure 64 (FIGS. 7-9). In embodiments wherein molded panel 30 is not singulated, or in embodiments wherein panel 30 is singulated into relatively large pieces each including multiple antenna structures, the antenna structures may collectively form one or more frontside antenna arrays. This may be more fully appreciated by referring to FIG. 10, which illustrates molded panel 30 after the formation of antenna structures 64 thereover, which collectively form a grid-shaped antenna array. In the illustrated example, antenna structures 64 are formed over a central region of molded panel 30 and power/ground bond pads 70 are distributed along outer peripheral edge region 34 of panel 30 in a number of clusters or bond pad arrays. This example notwithstanding, the disposition of bond pads 70 and antenna structures 64 will vary amongst different embodiments. In the illustrated embodiment, FO-WLP package 42 encompasses the entire molded panel 30 and, thus, may serve as an RF imaging device. In other embodiments, molded panel 30 undergoes singulated after patterning of dielectric layer 66 to produce a number of other FO-WLP packages including package 42. Each FO-WLP package may include one or more antenna structures 64 and one more embedded die 32 (FIGS. 1-9), which are embedded within a singulated piece of panel 30 (the package body). In either case, RF interference between antenna structures 64 and ground/power plane 50 is prevented or at least reduced due, at least in part, to the stand-off provided by molded RF stand-off layer 58 (FIGS. 5-9). Furthermore, while FO-WLP package 42 is produced as a single-sided, solder free package in the illustrated embodiment, FO-WLP package 42 may be produced as a doubled-sided package including a different type of contact array, such as a frontside and/or backside ball grid array, in further embodiments.

Figure 11:
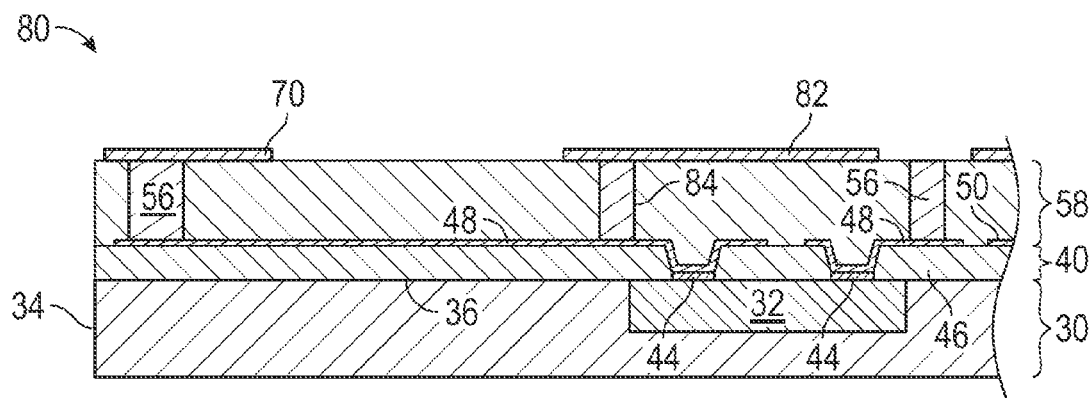
FIGS. 11 and 12 are cross-sectional views of a FO-WLP package shown at various stages of completion, which may be produced utilizing the molded panel shown in FIG. 1 and which is illustrated in accordance with a further exemplary embodiment of the fabrication method.
Figure 12:
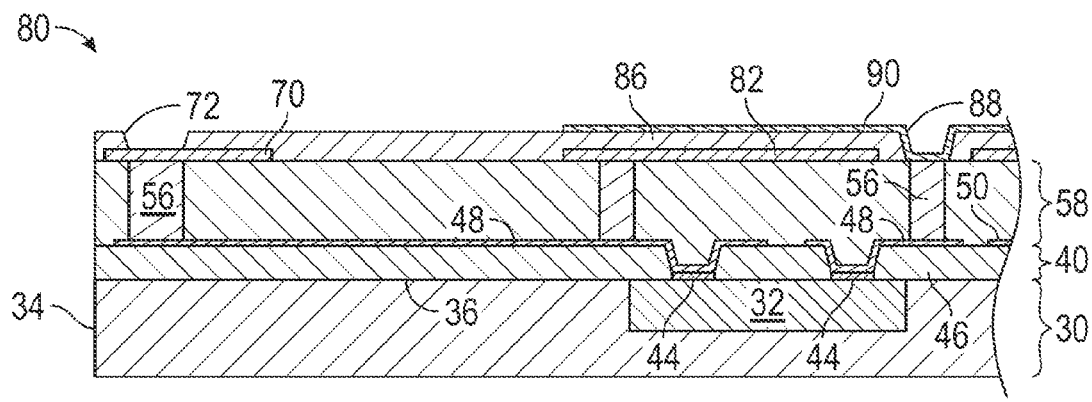
Figure 13:
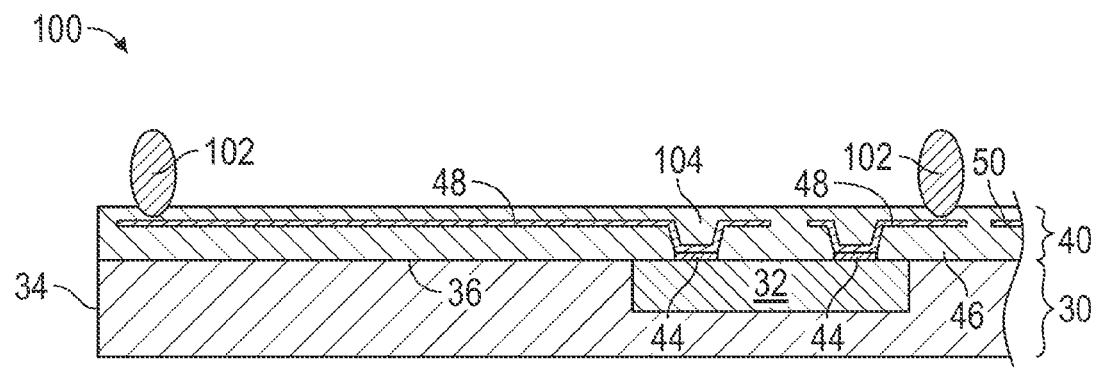
FIGS. 13-16 are cross-sectional views of a FO-WLP package shown at various stages of completion, which may be produced utilizing the molded panel shown in FIG. 1 and which is illustrated in accordance with a further exemplary embodiment of the fabrication method.

There has thus been provided an exemplary embodiment of one manner in which a FO-WLP package can be produced to include a molded RF stand-off layer, which provides a dielectric gap or stand-off between one or more frontside antenna structures and a ground/power plane (and/or other potential sources of RF interference) underlying the antenna structures and contained with the package. Advantageously, the above-described fabrication method can readily be adapted to produce one or more additional patterned metal levels above the molded RF stand-off layer, if desired. For example, as shown in FIG. 11 wherein like reference numerals are utilized to denote like structural elements and wherein the partially-completed FO-WLP package is identified by reference numeral "80," a first metal level may be formed over molded RF stand-off layer 48 and patterned to include an additional ground plane 82 along with power/ground bond pads 70. To electrically couple plane 82 to RDL interconnect lines 48, one or more additional vertically-elongated contacts 84 are also produced within molded RF stand-off layer 48. A dielectric layer 86 may be spun-on or otherwise deposited over the patterned metal level. Openings 72 and 88 are then created within layer 86 to expose bond pads 70 and one or more vertically-elongated contacts 56, respectively. Finally, an antenna structure 90 may be produced over dielectric layer 86 and in ohmic contact with the vertically-elongated contacts 56 utilizing a lithographic patterning and metal plating process of the type described above in conjunction with FIG. 7. By producing an additional ground plane 82 in this manner, shielding of RF signal interference between antenna structure 90, ground/power plane 50, and/or other components included within package 80 (e.g., the circuit or circuits carried by die 32) may be provided. Ground plane 82 may be an unconnected "dummy" structure or may be connected to a common ground in an embodiment. When viewed from a top-down perspective, plane 82 may assume the form of an uninterrupted metallic sheet having, for example, a rectangular planform geometry that covers die 32 in its entirety or at least in substantial part, as taken through the thickness of package 80 (that is, along an axis substantially orthogonal to the frontside of package 80 and die 32).

Figure 14:
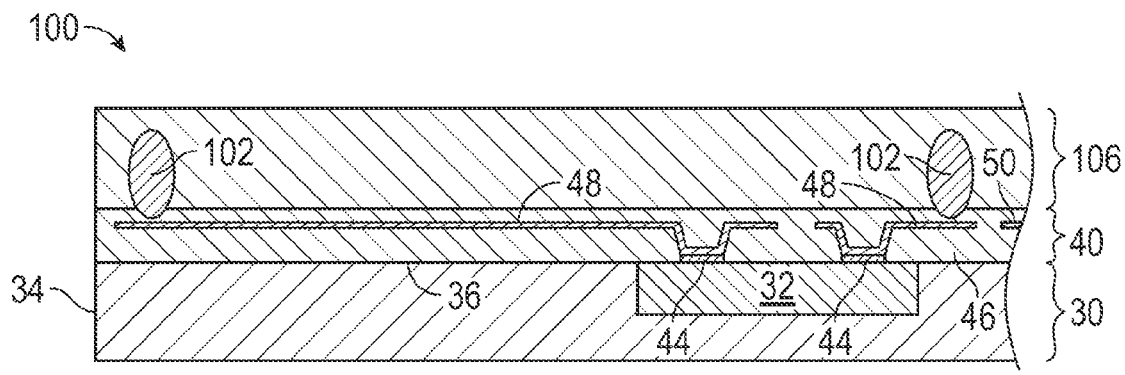

In the above-described exemplary embodiments, the vertically-elongated contacts assumed the form of a number of plated pillars 56 (FIGS. 4-9 and 11-13). As emphasized above, the vertically-elongated contacts can assume the form of any electrically-conductive bodies or structures suitable for providing electrical communication across molded RF stand-off layer 58 (FIGS. 5-9, 11, and 12). For example, in further embodiments, the vertically-elongated contacts may comprise metal slugs, posts, or studs, which are prefabricated, placed in the desired positions utilizing a pick-and-place tool, and possibly bonded in place utilizing a solder or an electrically conductive adhesive, such as a silver- or copper-filled epoxy. As a more specific example, metal (e.g., copper) slugs or posts having, for example, a generally rectangular similar to that of a surface mount device may be placed in their desired positions and then secured in place utilizing a solder reflow process. In still further embodiments, vertically-elongated contacts may assume the form of deposited metallic bodies, such as solid solder balls or solder-plated metal spheres (both considered "solder balls" in the context of the present document). FIGS. 13-16 illustrate a further embodiment of the fabrication method wherein the vertically-elongated contacts assume the form of solder balls. With initial reference to FIG. 13 wherein like reference numeral have been utilized to denote like reference and wherein the partially-completed FO-WLP package is identified by reference numeral "100," a plurality of solder balls 102 may be deposited over RDL layers 40 and in ohmic contact with selected regions of interconnect lines 48. Solder balls 102 may be deposited to have an oblong or vertically-elongated spherical shape, as indicated in FIG. 14; however, this is by no means necessary. A solder reflow process may then be carried-out to bond balls 102 to the selected regions of interconnect lines 48. To maintain the positioning of solder balls 102 during solder reflow, RDL layers 40 may be produced to include an additional outer dielectric layer 104 (e.g., a solder mask layer), which is patterned to include openings exposing selected regions of interconnect lines 48 and in which solder balls 102 may be seated. Although the lower portions of solder balls 102 are surrounded by RDL dielectric layer 104, solder balls 102 are still considered freestanding at the stage of manufacture shown in FIG. 14 as the majority of each solder ball 102 remains laterally unsupported.

Figure 15:
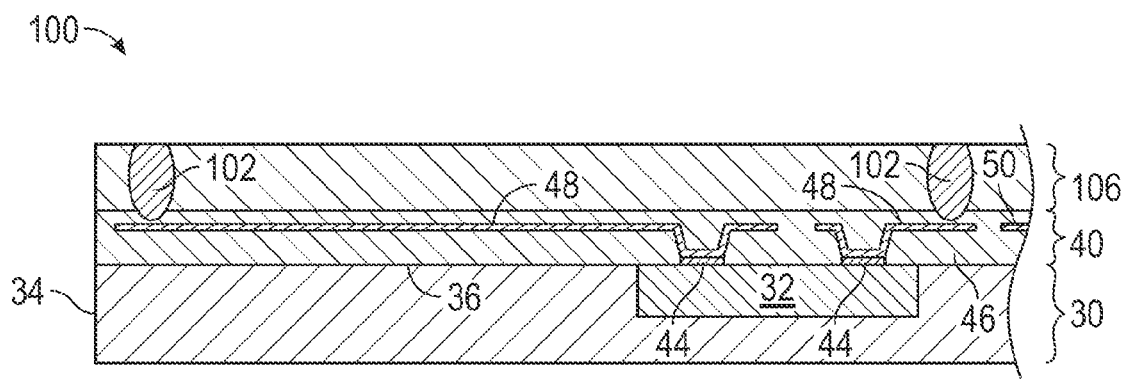
Figure 16:
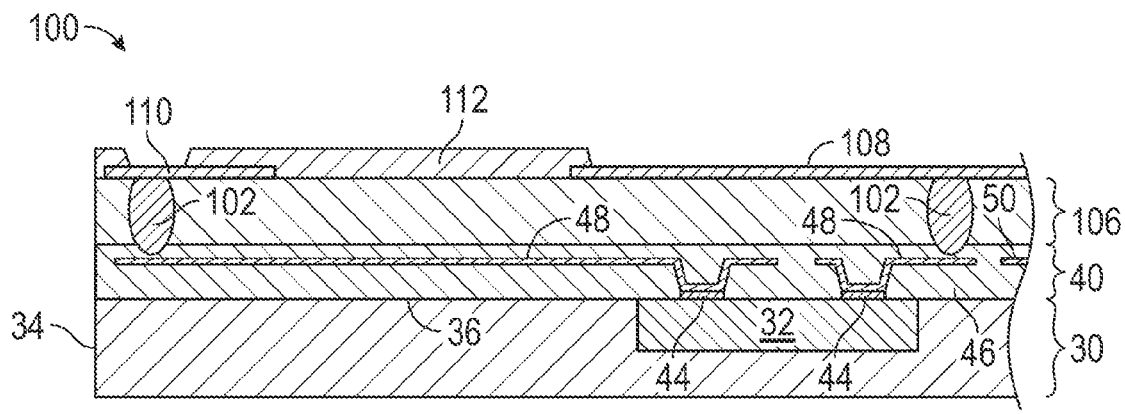

After deposition and attachment of solder balls 102, fabrication processes similar to those described above in conjunction with FIGS. 5-8 can be performed to complete fabrication of FO-WLP package 100. In particular, as shown in FIG. 15, a mold material may be dispensed over RDL layers 40 and around freestanding solder balls 102 and then cured to yield a molded RF separation or stand-off layer 106. If the molded RF stand-off layer 106 covers solders balls 102, a planarization process can be carried-out to impart layer 106 with a planar outer surface through which solder balls 102 are exposed. Notably, in embodiments wherein solder balls 102 comprise solder-plated metal (e.g., copper) spheres, planarization may remove the solder plating or shell and expose the metal (e.g., copper) core of the solder ball to facilitate the formation of a low resistance electrical connection thereto. Afterwards, a metal level may be produced over molded RF stand-off layer 106 and patterned to define an antenna structure 108 and, perhaps, other electrically-conductive features (e.g., power/ground bond pads 110) in ohmic contact with solder balls 102 extending through RF stand-off layer 106. As was the case previously, a dielectric layer 112 may also be deposited over the patterned metal level and lithographically patterned to reveal antenna structure 108 and power bond pads 110 therethrough. The structure shown in FIG. 16 results. If FO-WLP package 100 is made-up of the entire processed panel 30, the fabrication method may conclude after patterning of dielectric layer 112. Alternatively, molded panel 30 may be singulated to produce a number of FO-WLP packages in which FO-WLP package 100 is included. In further embodiments, solder balls may be attached to bond pads 70 to create a BGA over the frontside of FO-WLP package 100.

The foregoing has thus provided embodiments of method for producing wafer level microelectronic packages, such as FO-WLP packages, wherein one or more frontside antenna structures are spatially separated from ground/power planes included within the RDL layers (or other features within the package that could potentially cause RF-interference). As described above, embodiments of the fabrication method entail the production of a molded RF separation or stand-off layer with achieves a desired stand-off in a highly efficient and cost effective manner. While described above primarily in conjunction with FO-WLP packages, it will be appreciated that embodiments of the below-described fabrication method can also be employed to produce other types of wafer level packages, including FI-WLP and CSP packages. In one embodiment, the above-described microelectronic package fabrication method includes the step/process of producing a plurality of vertically-elongated contacts, such as a number of solder balls or plated pillars, in ohmic contact with interconnect lines contained within one or more redistribution layers built over the frontside of a semiconductor die. A molded RF stand-off layer is formed over the redistribution layers through which the plurality of vertically-elongated contacts extend. An antenna structure is fabricated or otherwise provided over the molded RF stand-off layer and electrically coupled to the semiconductor die through at least one of the plurality of vertically-elongated contacts.

In a further embodiment, the above-described package fabrication method includes producing vertically-elongated contacts in ohmic contact with a number of core packages embedded within a molded panel. In this case, the "core package" may include any structure or device containing at least one semiconductor die and a number of points-of-contact to provide electrical communication with the semiconductor die. In preferred embodiments, the core packages each include a semiconductor die over which a plurality of redistribution layers has been formed, such as semiconductor die 32 over which RDL layers 40 are formed as shown in FIGS. 3-9 and 11-16 above. The vertically-elongated contacts project upwardly away from the molded panel and are freestanding with respect thereto. A molded RF stand-off layer is formed over the frontside of the molded panel covering the vertically-elongated contacts. The molded RF stand-off layer is planarized to impart the molded RF stand-off layer with a planar outer surface through which the vertically-elongated contacts are exposed. Finally, a number of antenna structures are fabricated over the planar outer surface of the molded RF stand-off layer and electrically coupled to the core packages through the vertically-elongated contacts.

Embodiments of a microelectronic package, such as a FO-WLP package, are also provided. In one embodiment, the microelectronic package includes a semiconductor die and one or more redistribution layers, which overlie the semiconductor die and which contain a plurality of interconnect lines. A molded RF stand-off layer further overlies the redistribution layers and may have a thickness of, for example, about 100 to about 250 µm. A plurality of vertically-elongated contacts are formed in ohmic contact with the interconnect lines and extend through the molded RF stand-off layer. An antenna structure is formed over the molded RF stand-off layer and is electrically coupled to the semiconductor die through at least one of the plurality of vertically-elongated contacts. In certain embodiments, the microelectronic package may further contain a plurality of semiconductor die in which the first semiconductor is included, as well as a molded panel in which the plurality of semiconductor die is embedded and over which the redistribution layers and the molded RF stand-off layer are disposed. In such embodiment, the microelectronic package may also comprise an antenna array in which the first antenna structure is included. The antenna array may be electrically coupled to the plurality of semiconductor die through the plurality of vertically-elongated contacts.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a microelectronic package, comprising:
   producing a plurality of vertically-elongated contacts in ohmic contact with interconnect lines contained within at least one redistribution layer built over a molded panel containing a plurality of semiconductor die, the molded panel having a frontside at which the plurality of semiconductor die is exposed, the at least one redistribution layer produced over the frontside of the molded panel and the plurality of semiconductor die;
   forming a molded radiofrequency (RF) stand-off layer over the frontside of the molded panel and on the at least one redistribution layer such that the plurality of vertically-elongated contacts extends through the molded RF stand-off layer; and
   providing a plurality of antenna structures over the molded RF stand-off layer and electrically coupled to the plurality of semiconductor die through the plurality of vertically-elongated contacts;
   wherein the at least one-redistribution layer comprises a plurality of redistribution layers having an outer dielectric layer in which openings are formed exposing regions of the interconnect lines, and wherein producing a plurality of vertically-elongated contacts comprises depositing electrically-conductive bodies in the openings and in ohmic contact with the exposed regions of the interconnect lines.

2. The method of claim 1 wherein the at least one redistribution layer comprises a plurality of redistribution layers containing a last dielectric layer, and wherein the molded RF stand-off layer is formed to have a thickness at least twice the thickness of the last dielectric layer included within the plurality of redistribution layers.

3. The method of claim 1 wherein the plurality of vertically-elongated contacts is produced prior to formation of the molded RF stand-off layer.

4. The method of claim 3 wherein forming a molded RF stand-off layer comprises:
   depositing a mold material over the at least one redistribution layer and the plurality of vertically-elongated contacts; and
   curing the mold material to produce the molded RF stand-off layer.

5. The method of claim 4 wherein the molded RF stand-off layer covers the plurality of vertically-elongated contacts, and wherein the method further comprises planarizing the molded RF stand-off layer to impart the molded RF stand-off layer with a planar outer surface through which the plurality of vertically-elongated contacts is exposed.

6. The method of claim 1 wherein the electrically-conductive bodies comprise solder balls.

7. The method of claim 1 wherein the electrically-conductive bodies each comprise a copper core surrounded by a solder plating, and wherein the method further comprises planarizing the electrically-conductive bodies after forming the molded RF stand-off layer to partially remove the solder plating and expose the copper core through the molded RF stand-off layer.

8. The method of claim 1 wherein providing the plurality of antenna structures comprises fabricating the antenna structures over the at least one redistribution layer utilizing a photolithographical patterning and metal plating process.

9. The method of claim 1 wherein the plurality of antenna structures form an antenna array, wherein the antenna array is located in a central region of the molded panel, and wherein the method further comprises producing power/ground bond pads along an outer peripheral portion of the molded panel electrically coupled to the plurality of semiconductor die.

10. The method of claim 1 wherein the at least one redistribution layer comprises a plurality of redistribution layers built to include a first ground layer electrically coupled to the antenna structures through the plurality of vertically-elongated contacts.

11. The method of claim 1 wherein the molded RF stand-off layer is formed to have a thickness of at least 70 microns.

12. A method for fabricating a microelectronic package, comprising:
   producing a plurality of vertically-elongated contacts in ohmic contact with interconnect lines contained within a plurality of redistribution layers built over a molded panel containing a plurality of semiconductor die, the molded panel having a frontside at which the plurality of semiconductor die is exposed, the plurality of redistribution layers produced over the frontside of the molded panel and the plurality of semiconductor die, the plurality of redistribution layers including a first ground layer;

forming a molded radiofrequency (RF) stand-off layer over the frontside of the molded panel and on the plurality of redistribution layers such that the plurality of vertically-elongated contacts extends through the molded RF stand-off layer;

producing a second ground layer over the molded RF stand-off layer, the second ground layer substantially covering the plurality of semiconductor die as taken along an axis orthogonal to a frontside of the molded panel semiconductor die;

depositing a dielectric layer over the second ground layer; and producing a plurality of antenna structures over the dielectric layer and over the molded RF stand-off layer, the plurality of antenna structures electrically coupled to the plurality of semiconductor die and to the first ground layer through the plurality of vertically-elongated contacts.

13. The method of claim 12 wherein producing a plurality of vertically-elongated contacts comprises:
depositing a photoimagable material over the plurality of redistribution layers;
creating via openings in the photoimagable material exposing regions of the interconnect lines; and
plating metal pillars in the via openings and over the exposed regions of the interconnect lines to produce the plurality of vertically-elongated contacts.

14. The method of claim 13 further comprising stripping the photoimagable material after plating the metal pillars, and wherein forming a molded RF stand-off layer comprises depositing the molded RF stand-off layer over the plurality of redistribution layers and around the metal pillars.

15. The method of claim 12 wherein the plurality of redistribution layers contains a last dielectric layer, and wherein the molded RF stand-off layer is formed to have a thickness at least twice the thickness of the last dielectric layer.

16. The method of claim 12 wherein the plurality of vertically-elongated contacts is produced prior to formation of the molded RF stand-off layer.

17. The method of claim 16 wherein forming a molded RF stand-off layer comprises:
depositing a mold material over the plurality of redistribution layers and the plurality of vertically-elongated contacts; and
curing the mold material to produce the molded RF stand-off layer.

18. The method of claim 12 wherein producing a plurality of vertically-elongated contacts comprises:
depositing a photoimagable material over the plurality of redistribution layers;
creating via openings in the photoimagable material exposing regions of the interconnect lines; and
plating metal pillars in the via openings and over the exposed regions of the interconnect lines to produce the plurality of vertically-elongated contacts.

19. The method of claim 12 wherein the plurality of redistribution layers has an outer dielectric layer in which openings are formed exposing regions of the interconnect lines, and wherein producing a plurality of vertically-elongated contacts comprises depositing electrically-conductive bodies in the openings and in ohmic contact with the exposed regions of the interconnect lines.

20. The method of claim 12 wherein the plurality of antenna structures form an antenna array, wherein the antenna array is located in a central region of the molded panel, and wherein the method further comprises producing power/ground bond pads along an outer peripheral portion of the molded panel electrically coupled to the plurality of semiconductor die.

* * * * *